United States Patent
Kihlberg

(10) Patent No.: US 8,223,994 B2
(45) Date of Patent: Jul. 17, 2012

(54) METHOD OF LIMITING THE MAXIMUM PERMITTED SOUND VOLUME IN AN EARPHONE, AND AN EARPHONE FOR CARRYING OUT THE METHOD

(75) Inventor: Roger Kihlberg, Varnamo (SE)

(73) Assignee: 3M Svenska Aktiebolag, Sollentuna (SE)

( * ) Notice: Subject to any disclaimer, the term of this patent is extended or adjusted under 35 U.S.C. 154(b) by 774 days.

(21) Appl. No.: 12/373,180

(22) PCT Filed: Jun. 7, 2007

(86) PCT No.: PCT/SE2007/000545
§ 371 (c)(1),
(2), (4) Date: Feb. 24, 2009

(87) PCT Pub. No.: WO2008/013488
PCT Pub. Date: Jan. 31, 2008

(65) Prior Publication Data
US 2009/0252349 A1  Oct. 8, 2009

(30) Foreign Application Priority Data
Jul. 12, 2006  (SE) .................................. 0601546

(51) Int. Cl.
*H03G 3/00* (2006.01)
(52) U.S. Cl. ............... 381/107; 381/55; 381/59
(58) Field of Classification Search .................. 381/55, 381/59, 107, 183
See application file for complete search history.

(56) References Cited

U.S. PATENT DOCUMENTS

| | | | |
|---|---|---|---|
| 4,224,470 A | 9/1980 | Persson et al. | |
| 4,538,296 A | 8/1985 | Short et al. | |
| 4,944,015 A * | 7/1990 | Juve et al. | 381/55 |
| 4,975,949 A | 12/1990 | Wimsatt et al. | |
| 5,369,711 A | 11/1994 | Williamson, III | |
| 5,701,352 A | 12/1997 | Williamson, III | |

(Continued)

FOREIGN PATENT DOCUMENTS
AU  1002283  7/1983
(Continued)

OTHER PUBLICATIONS

Supplementary Search Report from European Application No. 07748208 dated Mar. 4, 2010.

(Continued)

*Primary Examiner* — Phuc Dang
(74) *Attorney, Agent, or Firm* — Eric D. Levinson

(57) ABSTRACT

A method of limiting the maximum permitted sound volume in an earphone, a headset or the like, includes the step that the size of the driving signal for driving the earphone is sensed. The driving signal has a voltage that is less than approx. 0.7 V. If the driving signal exceeds a certain level, one part of the driving signal is shunted past the earphone and another part of the driving signal is diverted. Either the voltage of the diverted part is increased and controls the shunt device by which the first part of the driving signal is shunted past the earphone, or it is supplied to a unit with a detector device and the shunt device. The unit is sensitive to work at voltages below approx. 0.7 V. An earphone or the like for the above-mentioned method comprises a shunt device and a detector device whose current source is the signal source of the earphone.

6 Claims, 4 Drawing Sheets

U.S. PATENT DOCUMENTS

| | | | |
|---|---|---|---|
| 6,757,381 B1 * | 6/2004 | Worley | 379/399.01 |
| 7,869,608 B2 * | 1/2011 | Sander et al. | 381/113 |
| 2003/0223612 A1 | 12/2003 | Knorr et al. | |
| 2004/0120534 A1 | 6/2004 | Mills, Jr. | |
| 2004/0131214 A1 | 7/2004 | Galler et al. | |
| 2006/0013414 A1 | 1/2006 | Shih | |
| 2009/0182913 A1 * | 7/2009 | Rosenblatt et al. | 710/72 |

FOREIGN PATENT DOCUMENTS

| | | |
|---|---|---|
| EP | 1558059 | 7/2005 |
| GB | 2120903 A | 12/1983 |
| SE | 410695 | 12/1976 |
| WO | WO 02/07480 A2 | 1/2002 |
| WO | 03/079722 A1 | 9/2003 |

OTHER PUBLICATIONS

International Search Report PCT/SE2007/000545, Dated Nov. 13, 2007.

* cited by examiner

METHOD OF LIMITING THE MAXIMUM PERMITTED SOUND VOLUME IN AN EARPHONE, AND AN EARPHONE FOR CARRYING OUT THE METHOD

CROSS REFERENCE TO RELATED APPLICATIONS

This application is a national stage filing under 35 U.S.C. 371 of PCT/SE2007/000545, filed Jun. 7, 2007, which claims priority to Swedish Application No. 0601546-5, filed Jul. 12, 2006, the disclosures of which are incorporated by reference in their entirety herein.

TECHNICAL FIELD

The present invention relates to a method of limiting the maximum permitted sound volume in an earphone, a headset or the like, where a driving signal for driving the earphone or the headset has a voltage that is less than approx. 0.7 V, the method including the steps that the size of the driving signal is sensed and that, on driving signals exceeding a certain level, a part of the driving signal is shunted past the earphone or headset.

The present invention also relates to an earphone or a headset with a limitation arrangement of the maximum permitted sound volume when a signal source has an output signal of a voltage which is less than approx. 0.7 V, including a detector device for sensing the size of the output signal and for generating a control signal reflecting the size of the output signal, a shunt device to which the control signal is connected and which is operative, on signals exceeding a given value, to shunt a part of the output signal past the earphone or headset, and a current source for driving the detector device and/or the shunt device.

BACKGROUND ART

Methods and apparatuses are previously known in the art for limiting the sound volume in an apparatus for sound reproduction. One such apparatus comprises a signal source which is connected to a headset, an earphone, a loudspeaker or the like. In such prior art apparatuses, the level limitation is put into effect in that a part of the output signal of the signal source is diverted and led to a detector where the size of the output signal is established. In proportion to the output signal, the detector subsequently generates a control signal which is led to a shunt device for controlling the signal. The shunt device is connected in such a manner that it can shunt a part of the output signal of the signal source past the headset, the earphone or the loudspeaker when the sensed size of the output signal exceeds a given value. This technology operates well as long as the output signal has a voltage exceeding approx. 0.7 V, which is the voltage required for being able to use conventional and commercially available silica based electronics of standard type.

In certain types of signal sources, such as MP3 players, iPods etc., the output signal may at a voltage which is considerably less than 0.7 V. This implies that the prior art technology cannot be applied, since the voltage is too low for causing silica based electronics to function.

Even if the output from a signal source of the abovementioned type may be as slight as 50-100 mW already at voltages that are clearly less than 0.7 V, this output fed in to an earphone of the earplug type may give rise to extremely high sound volumes. The problem becomes particularly severe if the earplug is passed into the acoustic meatus in such a manner that it seals against extraneous noise. In such situations, sound levels of considerably more than 100 dB may be reached despite the low supplied output.

In signal sources of the type under consideration here, in other words signal sources where the output voltage may be considerably less than approx. 0.7 V, the use is previously known in the art of software-based sound volume limitation arrangements. Such a limitation is integrated into the signal source and requires, for it to function, an earphone, headset or the like which is specifically adapted to the sound volume limitation and the signal source. If the earphone or the headset is replaced, the sound volume limitation arrangement will not function, since the replacement earphone could very well display a considerably higher level of sensitivity than the original earphone matched together with the signal source.

In the relevant type of signal source, i.e. where the voltage of the output signal may be considerably less than approx. 0.7 V, devices are also previously known in the art for limiting the maximum permitted sound volume. Such devices require however a separate voltage source in the form of a battery. Since the sound level limitation must be positioned in the earphone if this is to be able to be used together with an optional signal source, such a solution will be impractical and possibly impossible if the earphone is of the earplug type. Moreover, batteries must be regularly replaced.

Problem Structure

The present invention has for its object to realise a sound volume limitation arrangement which functions together with signal sources where the voltage of the output signal may be considerably less than 0.7 v. The present invention further has for its object to realise a sound volume limitation arrangement which requires no matching together between signal source and earphone, but where an earphone may be employed together with any optional signal source. Further, the present invention has for its object to realise a sound volume limitation which does not affect sound quality and which requires no separate voltage source in the form of a battery for its operation.

Solution

The objects forming the basis of the present invention will be attained regarding the method if this is characterised in that a second part of the driving signal is diverted, that its voltage is increased and that the diverted second part of the driving signal is directly or indirectly employed for controlling the shunt device in which the first part of the driving signal is shunted past the earphone or the headset.

The objects forming the basis of the present invention will be attained regarding the earphone if this is characterised in that the current source is the signal source.

BRIEF DESCRIPTION OF THE ACCOMPANYING DRAWINGS

The present invention will now be described in greater detail hereinbelow, with reference to the accompanying Drawings. In the accompanying Drawings.

DESCRIPTION OF PREFERRED EMBODIMENT

Figure 1:
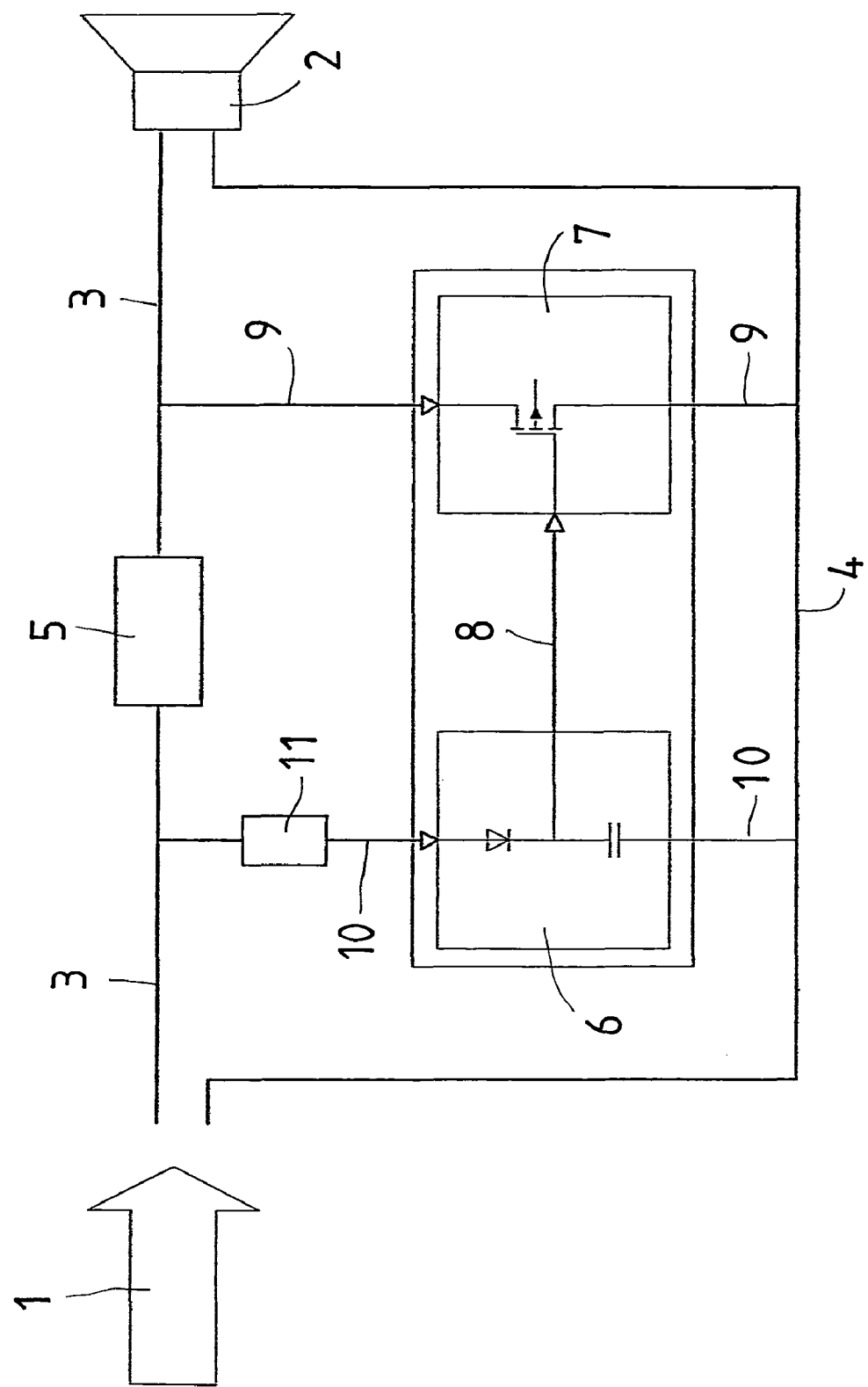
FIG. 1 is a simplified block diagram of a first embodiment of the present invention.

In FIG. 1, reference numeral 1 relates to a signal source which may be an iPod, an MP3 player or the like. Exactly which signal source is employed according to the present invention is of no consequence; it applying that the signal source has an output signal whose voltage at normal signal levels may be less than approx. 0.7 V. As an alternative to the concept of output signal, the designation driving signal will also be employed in the following description and in the appended Claims.

In FIG. 1, reference numeral 2 further relates to an earphone, a headset or the like, i.e. a device which converts the output signal of the signal source into sound. For the sake of simplicity, the term earphone will be employed throughout in the body of this description.

A first and second signal conductor 3 and 4, respectively, extend between the signal source 1 and the earphone 2, there being provided in the first signal conductor 3 a resistor 5 for reasons that will be disclosed below.

According to the present invention, the sound volume limitation arrangement is disposed in or together with the earphone, since the properties of the earphone, such as sensitivity, sealing tightness in the acoustic meatus, the air volume enclosed between the eardrum and the membrane of the earphone etc., determine the desired properties of the sound volume limitation arrangement. The earphone and the sound volume limitation arrangement are in other words adapted to one another.

It will further be apparent from FIG. 1 that there are disposed, between both signal conductors 3 and 4, a detector device 6 and a shunt device 7. Both the detector device 6 and the shunt device 7 are coupled between the first and second signal conductors 3 and 4, respectively. It should be observed that the shunt device 7 is connected after the resistor 5 so that the current that may pass through the shunt device 7 also passes through the resistor 5.

The detector device 6 senses directly or indirectly the voltage of the output signal of the signal source 1 and generates, in proportion thereto, a control signal which, via a control conductor 8, is fed to the shunt device 7 for controlling the shunt device. When the voltage of the output signal falls below a certain value, no control signal is generated, but when the voltage of the output signal exceeds a certain value, a control signal is emitted which, in the shunt device, ensures that a part of the output signal is shunted past the earphone 2 via a shunt conductor 9. The above-mentioned resistor 5 serves the purpose of preventing short-circuiting or overloading of the signal source 1 when a large part of the output signal is shunted past the earphone 2 via the shunt conductor 9.

It should be observed that both of the signal conductors 3 and 4 include no components which relate directly to the sound volume limitation arrangement, for which reason the sound quality is not affected by the sound volume limitation.

As was mentioned above, the signal source 1 has an output signal whose voltage, in normal operational state, may be considerably less than approx. 0.7 V. This implies that if the detector device and the shunt device are constructed using conventional, silica based components, the available voltage will, as a rule, not be sufficient to cause the detector device and the shunt device to function. According to the present invention, there is disposed, between the detector device 6 and the signal source 1, a voltage booster device or circuit 11.

In the block diagram according to FIG. 1, the voltage booster device or circuit is disposed in a detector conductor 10 between the signal conductors 3 and 4.

In a first variation of the present invention, the voltage booster device comprises a transformer with a transformation ratio of five or more, preferably ten or more.

The use of the voltage booster device 11 entails that the detector device will, even in such operational states when the output voltage of the signal source 1 falls considerably below 0.7 V, have access to a voltage level that comfortably exceeds 0.7 V, for which reason the detector device and the shunt device may be produced from commercially available, silica based and economical standard components.

Figure 2:
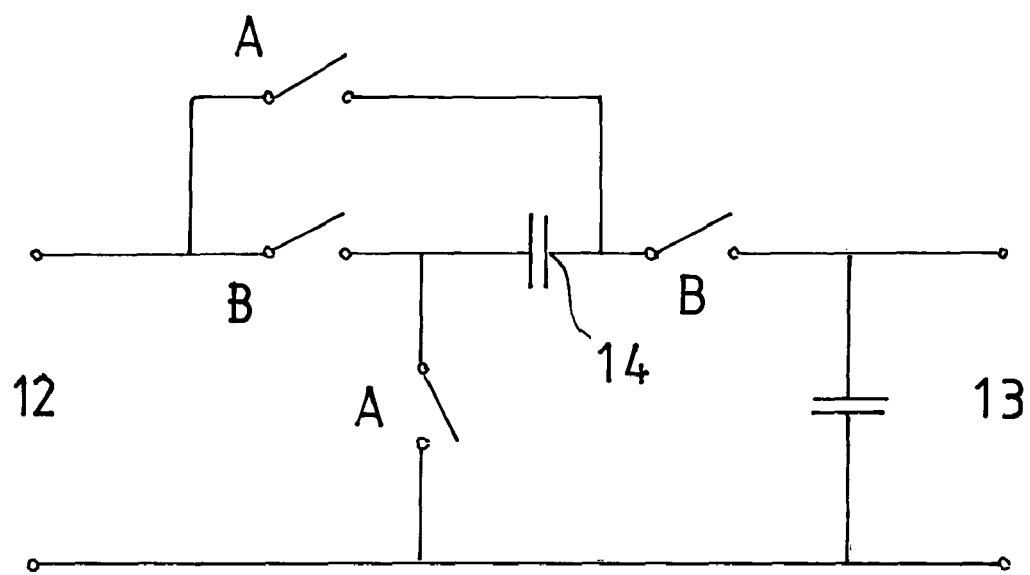
FIG. 2 is a voltage booster circuit included in the embodiment according to FIG. 1.

In a second variation of the present invention, the voltage booster circuit 11 is formed as a switched capacitor circuit which is illustrated in principle in FIG. 2. In a third variation of the present invention, the voltage booster circuit 11 is formed as a switched inductor circuit which is illustrated in principle in FIG. 3.

The voltage booster circuit illustrated in FIG. 2 has an input 12 and an output 13. The input 12 is connected to the signal source 1 and, as a result, has access to the low voltage that the signal source often emits. The output 13 is connected to the detector device 6 and supplies it with a voltage that at least exceeds 0.7 V.

The switched capacitor circuit according to FIG. 2 includes a first switch A and a second switch B. During operation, both of these switches are alternatingly opened and closed so that a capacitor 14 is alternatingly connected to the signal source and to earth so that its stored voltage is added to the incoming voltage which, without losses, could give rise to a doubling of the voltage. If, for example, the voltage on the input 12 is 0.5 V, there will theoretically be a voltage of 1.0 V on the output 13. If the losses in the circuit amount to 0.4 V, the actual voltage across the output 13 will be 0.6 V. If this voltage of 0.6 V is impressed to an identical circuit or at least an in principle identical circuit to that illustrated in FIG. 2, the voltage is doubled to 1.2 V on the output of this second circuit from which the losses of 0.4 V in the second circuit are to be deducted, and so the actual output voltage on the second circuit will be 0.8 V. Further steps may be coupled in after one another in series if the losses are greater or if a greater voltage boosting is required.

Figure 3:
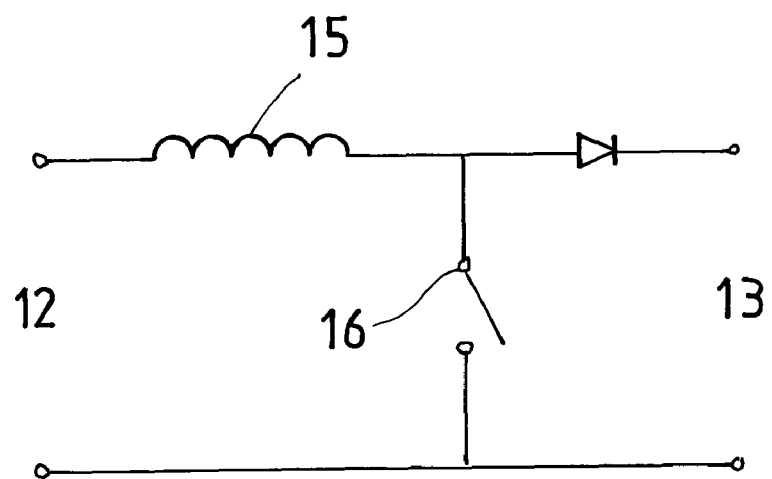
FIG. 3 shows an alternative voltage booster circuit included in the embodiment according to FIG. 1.

The switched inductor circuit illustrated din FIG. 3 has, like the above-described circuit according to FIG. 2, an input 12 and an output 13. Also here, the input 12 is connected to the signal source and the output 13 connected to the detector device 6. The circuit includes an inductor 15 and a switch 16 which is alternatingly opened and closed. By a suitable dimensioning of the inductor 5, the time relationship between the open and closed states of the switch 16 as well, as the opening and closing frequency of the switch, it is possible to obtain a voltage boosting by a factor of five or more.

In the embodiment according to FIG. 1, the voltage booster device or the circuit 11 is discrete from the detector device 6. At least in situations where the voltage booster circuit 11 is designed according to FIG. 2 or 3, the voltage booster circuit may, however, per se constitute or be included in a detector device which, on the output 13, delivers a control signal 8 which is led to the shunt device 7 for controlling the shunt device.

Figure 4:
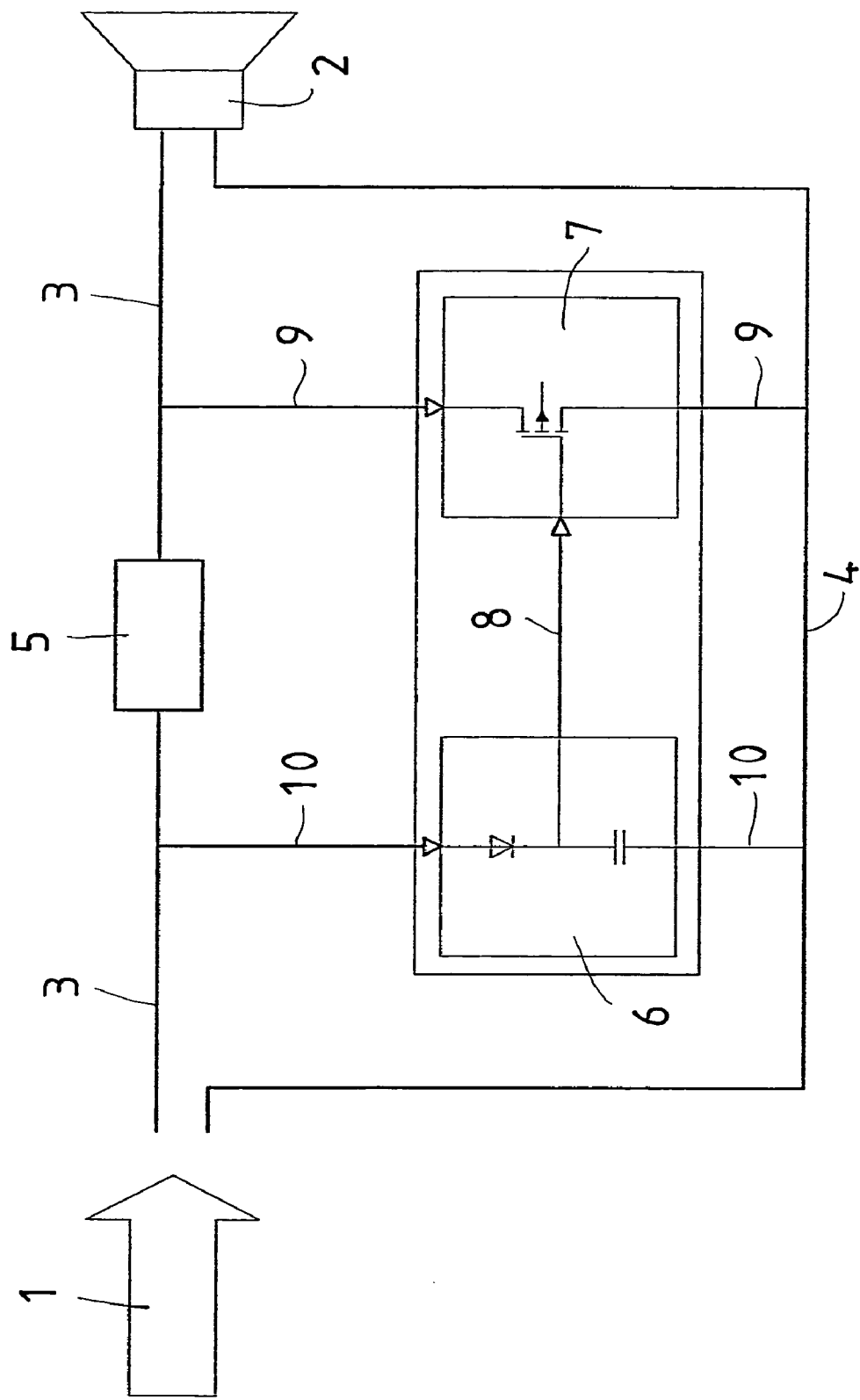
FIG. 4 is a simplified block diagram of a second embodiment of the present invention.

In the embodiment according to FIG. 4, no voltage booster device or circuit is employed. Instead, the detector device 6 and/or the shunt device 7 have been made more sensitive so that they are designed in order to be able also to operate at voltages considerably lower than approx. 0.7 V.

Figure 5:
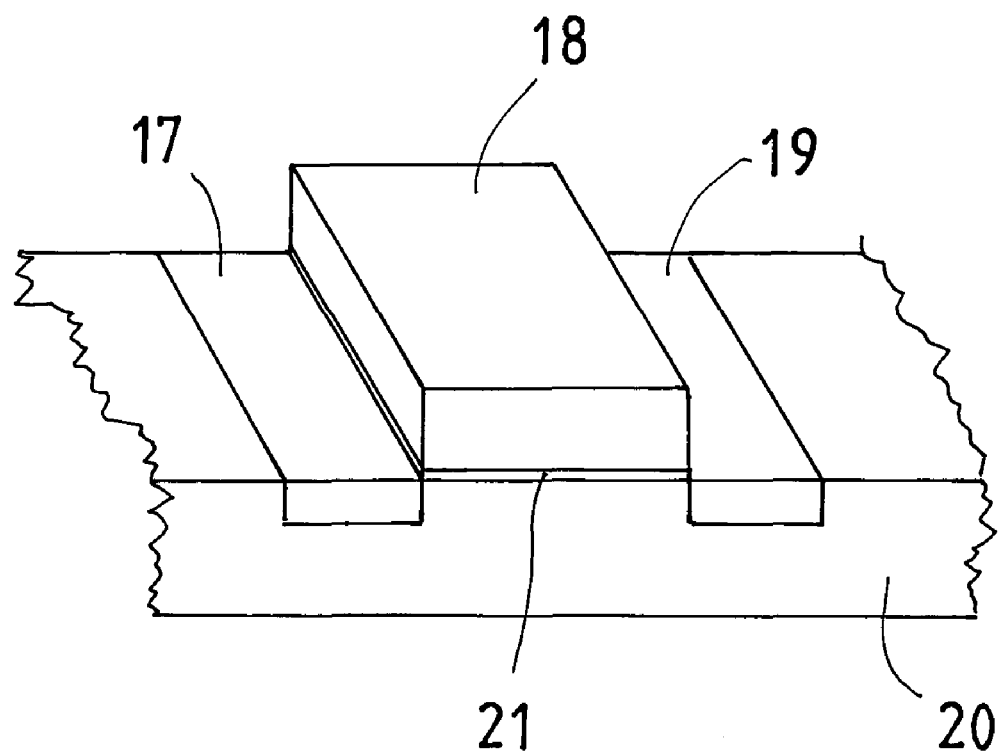
FIG. 5 is a schematic view of a part in an MOS transistor.

FIG. 5 shows a detail from an MOS transistor which is included in the detector device 6 and/or the shunt device 7. In FIG. 5, reference numeral 17 relates to the source of the transistor, reference numeral 18 to its gate and 19 to its drain. Reference numeral 20 relates to a silica based substrate included in the transistor.

Between the silica based substrate 20 and the gate 18 of the transistor, there is disposed an extremely thin layer 21, often consisting of silica dioxide. The capacitance which is formed between the gate of the transistor and the silica based substrate 20 considerably affects the voltage which the transistor requires in order to function. If this capacitance is increased, the voltage that is required for the function of the transistor is reduced. According to the invention, the layer 21 has been given a lesser layer thickness than that which applies in standard components. Alternatively, the dielectricity constant of the layer 21 may be increased by wholly or partly replacing the silica dioxide ($SiO_2$) with a substance with a higher dielectricity constant, e.g. one or more of the materials selected from the group essentially comprising $CeO_2$, $Gs_2O_3$, $ZrO_2$, $Y_2O_3$, $BaTiO_3$, or BaO/SrO which are all substances with a higher dielectricity constant than $SiO_2$. According to the present invention, the thickness of the layer 21 is either reduced alone, or together with an increase of the dielectricity constant of the layer 21 which, as was mentioned, may be put into effect by wholly or partly replacing the material in the layer 21.

What is claimed is:

1. A method of limiting the maximum permitted sound volume in an earphone, a headset or the like, where a driving signal for driving the earphone or the headset has a voltage that is less than approx. 0.7 V, the method including the steps that: the size of the driving signal is sensed and that, on driving signals exceeding a certain level, a part of the driving signal is shunted past the earphone or headset, characterised in that a second part of the driving signal is diverted and supplied to a unit comprising a detector device and a shunt device, in which the shunting of the first part of the driving signal takes place, and that the unit is given a sensitivity to operate at voltages of less than approx. 0.7 V, characterised in that an MOS transistor included in the unit is provided with an insulation layer between its gate and silica based substrate of reduced thickness and/or higher dielectricity constant.

2. An earphone or headset with limitation arrangement of the maximum permitted sound volume where a signal source (1) has an output signal of a voltage which is less than approx. 0.7 V, comprising: a detector device (6) for sensing the size of the output signal and for generating a control signal (8) which reflects the size of the output signal, a shunt device (7) to which the control signal is connected and which is disposed, on output signals exceeding a given value, to shunt a part of the output signal past the earphone (2) or the headset, and a current source for driving the detector device and/or the shunt device, characterised in that the current source is the signal source (1), characterised in that, between the signal source (1) and the unit comprising detector device/shunt device (6, 7), there is disposed a voltage booster unit (11).

3. The earphone or headset as claimed in claim 2, characterised in that the voltage booster unit (11) includes a transformer.

4. The earphone or headset as claimed in claim 2, characterised in that the voltage booster unit includes at least one switched (A, B) capacitor circuit (14).

5. The earphone or headset as claimed in claim 2, characterised in that the voltage booster unit (11) includes at least one switched (16) inductor circuit (15).

6. An earphone or headset with limitation arrangement of the maximum permitted sound volume where a signal source (1) has an output signal of a voltage which is less than approx. 0.7 V, comprising: a detector device (6) for sensing the size of the output signal and for generating a control signal (8) which reflects the size of the output signal, a shunt device (7) to which the control signal is connected and which is disposed, on output signals exceeding a given value, to shunt a part of the output signal past the earphone (2) or the headset, characterised in that the sound volume limitation properties of the detector (6) and/or the shunt device (7) are adapted to the sound reproducing properties of the earphone (2) or headset, namely sensitivity, sealing in the acoustic meatus, air volume enclosed between the eardrum and the membrane of the earphone or the headset, etc., and that a current source for driving the detector device (6) and/or the shunt device (7) is the signal source.

* * * * *